(12) United States Patent
Compagne

(10) Patent No.: US 7,443,322 B2
(45) Date of Patent: Oct. 28, 2008

(54) DEVICE FOR TESTING AN ANALOG-TO-DIGITAL CONVERTER

(75) Inventor: Eric Compagne, Crolles (FR)

(73) Assignee: Dolphin Integration, Meylan (FR)

( * ) Notice: Subject to any disclaimer, the term of this patent is extended or adjusted under 35 U.S.C. 154(b) by 186 days.

(21) Appl. No.: 11/588,857

(22) Filed: Oct. 27, 2006

(65) Prior Publication Data
US 2007/0111670 A1      May 17, 2007

(30) Foreign Application Priority Data
Oct. 28, 2005   (FR) .................................. 05 53295

(51) Int. Cl.
*H03M 1/10*   (2006.01)
(52) U.S. Cl. .................. 341/120; 341/143; 341/155
(58) Field of Classification Search .................. 341/120
See application file for complete search history.

(56) References Cited

U.S. PATENT DOCUMENTS

| | | | |
|---|---|---|---|
| 5,068,657 A * | 11/1991 | Tsai | 341/120 |
| 6,333,706 B1 * | 12/2001 | Cummings et al. | 341/120 |
| 6,339,389 B1 * | 1/2002 | Zade | 341/120 |
| 6,498,998 B1 | 12/2002 | Furukawa | |
| 6,580,380 B2 * | 6/2003 | Oh et al. | 341/120 |

FOREIGN PATENT DOCUMENTS

JP      61138173     6/1986

OTHER PUBLICATIONS

Huang et al., "Analog Signal Generator For BIST Of Wideband IF Signals Bandpass Sigma—Delta Modulator", Microelectronics Journal 34 (2003) pp. 85-91.
R.A. Belcher, "Multi-Tone Testing Of Quantiserss Using PRBS Signals", Computer Standards & Interfaces 22 (2000) pp. 269-279.
Roy et al, "High Accuracy Stimulus Generation For A/D Converter BIST", ITC International Test Conference, pp. 1031-1038.
International Search Report dated Feb. 2, 2006.

* cited by examiner

*Primary Examiner*—Khai M Nguyen
(74) *Attorney, Agent, or Firm*—Howard IP Law Group PC

(57) ABSTRACT

A device for testing an analog-to-digital converter providing a digital signal at a given sampling frequency, comprising a unit for providing a test signal to the converter, the test signal being a periodic signal comprising frequency components only at a fundamental frequency and at harmonics of the fundamental frequency, the fundamental frequency being a multiple of one quarter of the sampling frequency; a filter capable of receiving the digital signal and of rejecting the fundamental frequency to provide a filtered digital signal; and a unit capable of receiving the digital signal and the filtered digital signal and of providing a signal representative of the ratio between the effective powers of the digital signal and of the filtered digital signal.

10 Claims, 1 Drawing Sheet

DEVICE FOR TESTING AN ANALOG-TO-DIGITAL CONVERTER

BACKGROUND OF THE INVENTION

1. Field of the Invention

The present invention relates to a device for testing an analog-to-digital converter (ADC).

2. Discussion of the Related Art

A conventional analog-to-digital converter test comprises determining the signal-to-noise and distortion ratio (SINAD) of the converter. Term "distortion" corresponds to the frequency components present in the output signal other than the frequency components of the input signal. Such additional frequency components originate from the fact that the converter is not perfectly linear. This can be obtained via a test device temporarily connected to the converter and which provides the converter with a sinusoidal signal, stores samples provided by the converter, and determines, based on the memorized samples, the spectrum or frequency content of the digital signal provided by the converter from which the signal-to-noise and distortion ratio is determined. The spectrum or frequency content can be obtained by the determination of the fast Fourier transform of the digital signal provided by the converter.

A disadvantage of such a test is that the determination of the fast Fourier transform requires acquiring a significant number of samples, for example, from 10,000 to 20,000 in the case of an audio application. Further, the duration of a test implementing the fast Fourier transform determination is generally not negligible. As an example, for an audio application for which the sampling frequency of the converter is equal to 48 kHz, the duration of a test is generally greater than 1 second. Knowing that the cost of a test is directly linked to its duration, the cost of a test implementing the determination of a fast Fourier transform is generally high as compared with the cost of the actual circuit.

In many applications, an analog-to-digital converter of $\Sigma$-$\Delta$ type is used. Such a converter comprises a $\Sigma$-$\Delta$ modulator, which provides a generally binary signal at a frequency greater than the converter sampling frequency, and a filtering and decimation stage which provides a digital signal coded over several bits at the sampling frequency and eliminates the quantization noise outside of the useful signal band. An advantage of such a converter is that it can be entirely formed of a digital integrated circuit comprising no analog elements requiring accurate definition of their technical characteristics.

To decrease the cost of an analog-to-digital converter test, it would be desirable for the converter to comprise its own test device so that a test operation can be automatically implemented during the converter operation. In particular, when the converter is formed of an integrated circuit, it would be desirable for the test device to be made in integrated fashion to be associated with the converter. However, the forming of an integrated circuit performing the fast Fourier transform determination is relative complex and requires a significant silicon surface area, with a cost that may be exorbitant.

SUMMARY OF THE INVENTION

The present invention aims at a device for testing an analog-to-digital converter, enabling determination of the signal-to-noise and distortion ratio or of the signal-to-noise ratio which is likely to be made in integrated fashion at reduced cost.

For this purpose, it provides a device for testing an analog-to-digital converter providing a digital signal at a given sampling frequency, comprising a unit for providing a test signal to the converter, the test signal being a periodic signal comprising frequency components only at a fundamental frequency and at harmonics of the fundamental frequency, the fundamental frequency being a multiple of one quarter of the sampling frequency; a filter capable of receiving the digital signal and of rejecting the fundamental frequency to provide a filtered digital signal; and a unit capable of receiving the digital signal and the filtered digital signal and of providing a signal representative of the ratio between the effective powers of the digital signal and of the filtered digital signal.

According to an example of embodiment of the present invention, the unit for providing the test signal is capable of providing a signal only comprising frequency components at the fundamental frequency and at odd harmonics of the fundamental frequency.

According to an example of embodiment of the present invention, the unit for providing the test signal is capable of providing a square periodic signal.

According to an example of embodiment of the present invention, the unit for providing the test signal is capable of providing a signal having its fundamental frequency equal to one quarter or to half of the sampling frequency.

According to an example of embodiment of the present invention, the converter comprises a filtering stage equivalent to a low-pass filter having its cut-off frequency equal to half of the sampling frequency.

According to an example of embodiment of the present invention, the converter is of sigma-delta type.

The present invention also provides a method for testing an analog-to-digital converter providing a digital signal at a given sampling frequency, comprising the steps of providing the converter with a test signal corresponding to a periodic signal comprising frequency components only at a fundamental frequency and at harmonics, the fundamental frequency being a multiple of one quarter of the sampling frequency; filtering the digital signal to reject the fundamental frequency; and determining the ratio between the effective powers of the digital signal and of the filtered digital signal.

According to an example of embodiment of the present invention, the test signal only comprises frequency components at the fundamental frequency and at odd harmonics of the fundamental frequency.

According to an example of embodiment of the present invention, the fundamental frequency is equal to one quarter or to half of the sampling frequency.

According to an example of embodiment of the present invention, the converter performs a low-pass type filtering of the digital signal at a cut-off frequency equal to half of the sampling frequency.

The foregoing and other objects, features, and advantages of the present invention will be discussed in detail in the following non-limiting description of specific embodiments in connection with the accompanying drawings.

DETAILED DESCRIPTION

Figure 1:
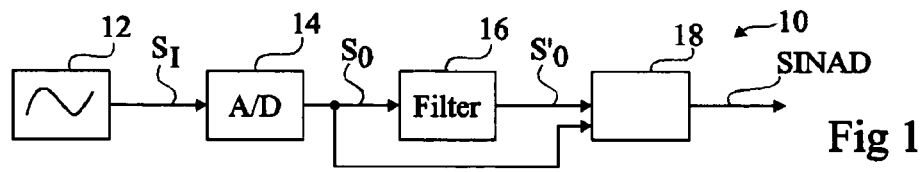
FIG. 1 schematically shows an example of a device for testing an analog-to-digital converter.

For clarity, same elements have been designated with same reference numerals in the different drawings.

A first attempt of the applicant has been to form an analog-to-digital converter test device enabling determination of the signal-to-noise and distortion ratio and operating as a distortion meter.

FIG. 1 shows an example of the forming of such a test device 10 of distortion meter type which comprises a unit 12 for providing a sinusoidal analog signal $S_I$ of frequency $F_I$ to an analog-to-digital converter 14 which provides a digital signal $S_O$ corresponding to a succession of digital values at a sampling frequency $F_S$. Signal $S_O$ is provided to a digital rejector filter 16 which is capable of rejecting frequency $F_I$ of digital signal $S_O$ and of providing a filtered digital signal $S_O'$. A unit 18 for determining the signal-to-noise and distortion ratio receives signals $S_O$ and $S_O'$ and determines the effective power of signal $S_O$ and the effective power of signal $S_O'$, and provides a signal SINAD corresponding to the ratio between the two effective powers which is representative of the signal-to-noise and distortion ratio of converter 14. Indeed, a sinusoidal signal being represented in the frequency field by a line at frequency $F_I$, signal $S_O'$ provided by filter 16 only contains the noise and distortion components due to converter 14.

An advantage of such a test device is that it requires a small number of samples to provide a value of the signal-to-noise and distortion ratio. For example, for an audio application, a number of from 500 to 1,000 samples is enough. The duration of a test is thus shorter than for a test implementing a fast Fourier transform.

A disadvantage of such a test device 10 is that it is difficult to make in the form of an integrated circuit which would be associated with converter 14. Indeed, while digital filter 16 and unit 18 for determining the signal-to-noise and distortion ratio can easily be made in integrated fashion while taking up a decreased silicon surface area, it is difficult to make unit 12 for providing the sinusoidal signal in integrated fashion. It is indeed difficult to form a low-cost integrated circuit providing a sinusoidal analog signal of accurate and adjustable frequency. It would further be necessary to provide specific circuits for testing unit 12 for providing the sinusoidal signal to check the proper operation thereof, which would further complicate the forming of test device 10.

To achieve the obtaining of a test device of distortion meter type likely to be made in integrated fashion at reduced cost, the applicant has shown that a specific test signal, other than sinusoidal, provided to the analog-to-digital converter had to be used to determine the signal-to-noise and distortion ratio. The applicant has shown that, for a given category of analog-to-digital converters, the provision of a periodic test signal only having a fundamental frequency and even and/or odd harmonics, enables provision of a digital signal by the converter, having a Fourier transform which is identical to that which would be obtained by driving the converter with a sinusoidal signal for a fundamental frequency judiciously selected with respect to the converter sampling frequency.

Hereinafter, the present invention will be described in further detail for a Σ-Δ-type analog-to-digital converter and for a square periodic test signal.

Figure 2:
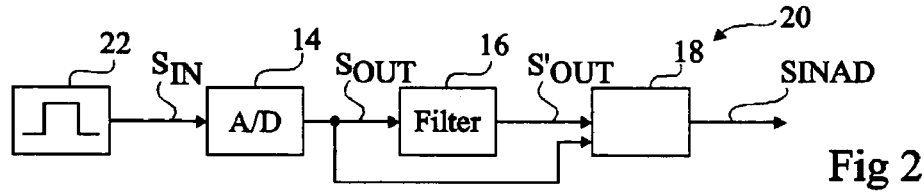
FIG. 2 shows an example of embodiment of a device for testing an analog-to-digital converter according to the present invention.

FIG. 2 shows an example of the forming of a test device 20 according to the present invention in which test device 20 comprises a unit 22 which provides a square periodic signal $S_{IN}$ of frequency $F_{IN}$ to converter 14. Converter 14 provides a digital signal $S_{OUT}$ corresponding to a succession of digital values at sampling frequency $F_S$. Signal $S_{OUT}$ is sent to filter 16 which provides a filtered signal $S_{OUT}'$. Unit 18 for determining the signal-to-noise and distortion ratio receives signals $S_{OUT}$ and $S_{OUT}'$ and provides a signal SINAD representative of the signal-to-noise and distortion ratio of converter 14.

Figure 3:
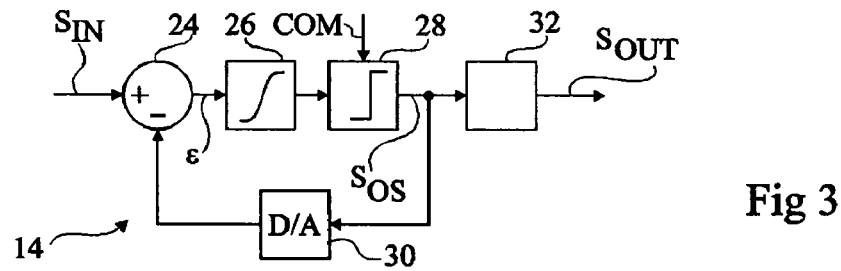
FIG. 3 schematically shows an example of the forming of a $\Sigma$-$\Delta$ converter.

FIG. 3 shows an example of embodiment of Σ-Δ converter 14 in which converter 14 comprises a subtractor 24 having its positive input (+) receiving signal $S_{IN}$ and which provides a signal ε to an integrator 26. Integrator 26 drives a comparator 28 which provides a binary signal $S_{OS}$ at the frequency of a control signal COM which is greater than sampling frequency $F_S$. Binary signal $S_{OS}$ is converted back into an analog signal by a digital-to-analog converter 30 which is provided to the negative input (−) of subtractor 24. Binary signal $S_{OS}$ is provided to a decimation and filtering unit 32 which provides digital signal $S_{OUT}$ over several bits at frequency $F_S$ while performing a filtering operation to reject the quantization noise due to comparator 28 outside of the useful frequency band of the signal.

Figure 4:
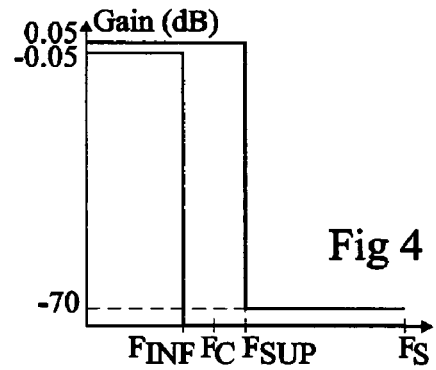
FIG. 4 shows an example of an attenuation contour of a filtering step of the converter of FIG. 3.

FIG. 4 shows an example of the attenuation contour of the filter equivalent to decimation and filtering unit 32. Said attenuation contour is that of a low-pass filter which comprises a cut-off frequency $F_C$ equal to $F_S/2$, and which ensures an attenuation greater than 70 dB for a frequency greater than $F_{SUP}$ and an attenuation lower 0.05 dB for a frequency lower than $F_{INF}$. As an example, for an audio application, frequencies $F_S$, $F_C$, $F_{SUP}$, and $F_{INF}$ are respectively equal to 48 kHz, 24 kHz, 30 kHz, and 19 kHz.

The approach implemented by the applicant to determine frequency $F_{IN}$ of signal $S_{IN}$ to be used to enable proper determination of signal SINAD will now be described. A square periodic signal $S_{IN}$ of duty cycle ½ and of frequency $F_{IN}$ may break up into a sum of sinusoidal signals according to the following relation:

$$S_{IN}(t) = \sum_{k=0}^{\infty} \frac{A_0}{2k+1} \sin((2k+1)(2\pi F_{IN} t))$$

Figure 5:
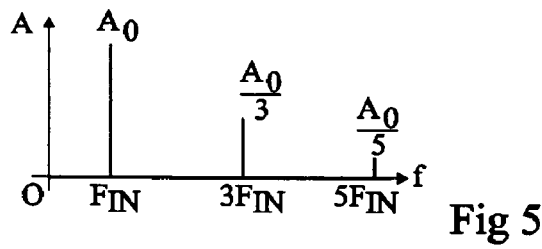
FIG. 5 shows, in the frequency field, an example of a square periodic analog signal.

FIG. 5 conventionally shows the expression in the frequency range of signal $S_{IN}$. A succession of lines of decreasing amplitudes is obtained, the line of frequency $F_{IN}$ corresponding to the fundamental line and the lines of upper frequencies corresponding to the odd harmonics (only the third and fifth harmonics being shown).

If a square periodic signal $S_{IN}$ of any frequency $F_{IN}$ is provided to converter 14 instead of a sinusoidal signal, the obtained signal $S_{OUT}$ comprises the odd harmonics of signal $S_{IN}$ which have not been filtered by decimation and filtering unit 32 of converter 14. Since filter 16 is defined to reject fundamental frequency $F_{IN}$ of signal $S_{OUT}$, signal $S_{OUT}'$ comprises not only the noise and the distortion components, but also certain odd harmonics. Signal SINAD determined from the effective power of signal $S_{OUT}'$ then no longer corresponds to the signal-to-noise and distortion ratio of converter 14 and cannot be used to determine the proper operation thereof.

A first approach would comprise selecting frequency $F_{IN}$ of signal $S_{IN}$ to be sufficiently high so that all the harmonics which are at frequencies greater than cut-off frequency $F_C$ of unit 32 are filtered. However, since converter 14 performs a sampling operation at frequency $F_S$ and unit 32 only performs an attenuation, and not a suppression, of the frequencies greater than cut-off frequency $F_C$, a folding of the harmonics of signal $S_{OUT}$ can be observed so that certain harmonics beyond cut-off frequency $F_C$ may be folded in the useful frequency band (that is, the frequency band which extends to $F_C$). Although the folded harmonics are attenuated by unit 32, they do not have negligible amplitudes and signal SINAD is then no longer representative of the signal-to-noise and distortion ratio of converter 14.

Figure 6:
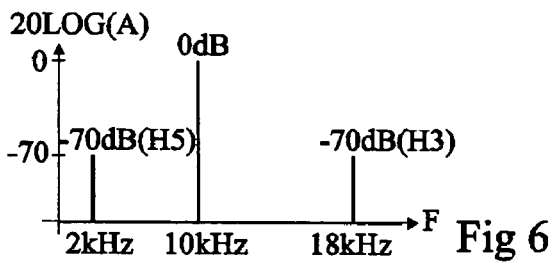
FIG. 6 shows, in the frequency field, an example of a signal provided by an analog-to-digital converter receiving a square periodic signal 10-kHz frequency.

FIG. 6 illustrates such a folding phenomenon and shows, in the frequency field, signal $S_{OUT}$ provided by converter 14 from a square signal $S_{IN}$ at a frequency $F_{IN}$ equal to 10 kHz, sampling frequency $F_S$ being equal to 48 kHz and cut-off frequency $F_C$ being equal to 24 kHz. A line at 10 kHz is effectively found again, which corresponds to the fundamental frequency and is not filtered by converter 14. However, the third harmonic (H3) of signal $S_{IN}$, at 30 kHz, is folded on sampling and provides a line at 18 kHz attenuated by 70 dB. Similarly, the fifth harmonic (H5) of signal $S_{IN}$, which is at 50 kHz, is folded and provides a line at 2 kHz attenuated by 70 dB. Such lines, which are not due to a lack of linearity of converter 14, are not filtered by filter 16 and are thus present in signal $S_{OUT}'$ provided to unit 18 for determining the signal-to-noise and distortion ratio.

The present invention comprises driving converter 14 with a square signal SIN such that the harmonics of signal $S_{OUT}$ fold exactly on the fundamental frequency. Thereby, after rejection of the fundamental frequency by filter 16, signal $S_{OUT}'$ only comprises the noise and the distortion frequency components introduced by converter 14.

A folding frequency FOUT is obtained from an input frequency $F_H$, by determining a coefficient k according to the following relation:

$$kF_S/2 \leq F_H \leq (k+1)F_S/2$$

A folding frequency $F_{OUT}$ is then obtained as follows:

if k is an odd integer: $F_{OUT}=(k+1)F_S/2-F_H$ (1)

if k is an even integer: $F_{OUT}=F_H-kF_S/2$ (2)

According to the present invention, fundamental frequency $F_{IN}$ of square signal $S_{IN}$ provided to converter 14 is determined so that the third harmonic folds on the fundamental frequency. Relation (1) provides, for an odd k:

$F_{IN}=(k+1)F_S/2-3F_{IN}$, that is, $F_{IN}=(k+1)F_S/8$

Relation (2) provides, for an even k:

$F_{IN}=3F_{IN}-kF_S2$, that is $F_{IN}=kF_S/4$

The solutions for which frequency $F_{IN}$ is lower than cut-off frequency $F_C=F_S/2$ of converter 14 are retained, that is:

$F_{IN}=F_S/4$ or $F_{IN}=F_S/2$

Similarly, it can be shown that for $F_{IN}=F_S/4$ and $F_{IN}=F_S/2$, all the odd harmonics are folded on $F_{IN}$.

For a square periodic signal $S_{IN}$ having $F_S/4$ or $F_S/2$ as a fundamental frequency, all the harmonics of signal $S_{IN}$ are folded by converter 14 on frequency $F_{IN}$. The spectrum of signal $S_{OUT}$ is thus identical to the spectrum which would have been obtained by applying a sinusoidal signal of frequency $F_{IN}$ to the input of converter 14.

By using a square signal $S_{IN}$ of frequency $F_S/4$, a line corresponding to the second harmonic, that is, to $F_S/2$, may appear to be due to the distortion introduced by converter 14. Such a line, being in the useful band, is not filtered by filtering and decimation unit 32. Filtered signal $S_{OUT}'$ thus contains noise and the second harmonic component due to distortion. Further, the even harmonics, due to the distortion, of an order greater than 2 are folded on the zero frequency or on frequency $F_S/2$. By using a square signal $S_{IN}$ of frequency $F_S/2$, the lines corresponding to even harmonics due to the distortion introduced by converter 14 are not in the useful band and are folded on the zero frequency. On determination of signal SINAD, in particular on determination of the effective power of signal $S_{OUT}'$, the component at the zero frequency is generally not taken into account, the effective power being determined from signal $S_{OUT}'$ decreased by its average value. Signal SINAD is then representative of the signal-to-noise ratio of converter 14. By successively applying signal $S_{IN}$ of frequency $F_{IN}$ equal to $F_S/4$ and $F_S/2$, the distortion introduced by converter 14 can be determined from the obtained values of signal SINAD.

To avoid parasitic noise which would not be due to converter 24 but to variations in the frequency of signal $S_{IN}$ (phenomenon generally designated as the jitter) with respect to signal COM which controls the operation of converter 14, it is desirable for signal $S_{IN}$ to be synchronous with signal COM.

Figure 7:
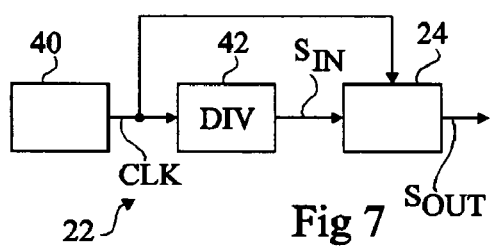
FIG. 7 shows an alternative embodiment of the test device according to the present invention.

FIG. 7 shows an example of embodiment in which unit 22 for providing test signal $S_{IN}$ comprises a unit 40 which provides a square periodic clock signal CLK at a high frequency to a divider 42 which divides clock signal CLK to obtain signal $S_{IN}$. Clock signal CLK is further provided to converter 14 to obtain control signal COM. As an example, for a sampling frequency $F_S$ equal to 48 kHz, clock signal CLK may be a square signal of frequency 12.288 MHz. Divider 42 then performs a division by 1,024 to obtain signal $S_{IN}$ at a 12-kHz frequency. Signal $S_{IN}$ is then synchronous with signal COM.

Figure 8:
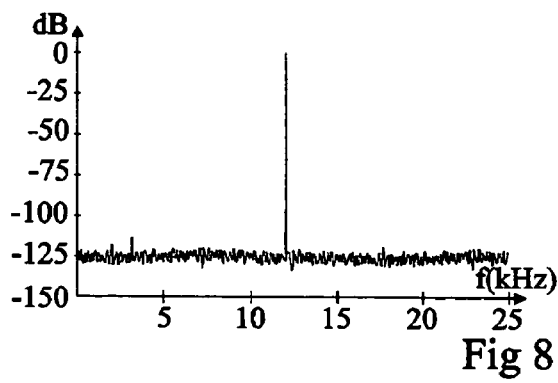
FIGS. 8 and 9 show, in the frequency field, examples of signals used by the test device according to the present invention.
Figure 9:
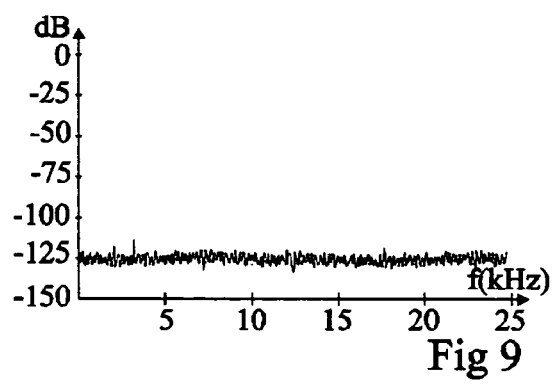

FIGS. 8 and 9 show, in the frequency field, signals $S_{OUT}$ and $S_{OUT}'$ obtained when converter 14 has a sampling frequency $F_S$ equal to 48 kHz and a cut-off frequency $F_C$ equal to 24 kHz and is driven by a square periodic signal $S_{IN}$ of frequency $F_{IN}$ equal to 12 kHz. It should be noted that signal $S_{OUT}$ comprises a single line at $F_S/4=12$ kHz and, for signal $S_{OUT}'$, the fundamental component at frequency $F_S/4$ has been suppressed by filter 26.

The present invention has been described for the provision of a signal $S_{IN}$ corresponding to a periodic square signal of duty cycle 0.5. Such a signal $S_{IN}$ has the advantage that it can be very easily obtained by means of switches connected to voltage sources and by division from the clock signal used for the converter control. However, the present invention may be implemented by using a square periodic signal $S_{IN}$ having a duty cycle different from 0.5. Further, the present invention may also be implemented by using a periodic signal $S_{IN}$ of triangular shape. Indeed, such signals only comprise, in the frequency range, odd harmonics of the fundamental frequency. By selecting frequency $F_{IN}$ in adapted fashion as described previously, the obtained signal $S_{OUT}$ only comprises a line at frequency $F_{IN}$ enabling correct determination of the signal-to-noise and distortion ratio.

More generally, the present invention may be implemented with any periodic signal $S_{IN}$ which comprises even and odd harmonics, and the obtaining of which is simpler than the obtaining of a sinusoidal signal and, in particular, any signal $S_{IN}$ that can be provided by a circuit that can easily be formed in integrated fashion. Indeed, for such a signal, by setting frequency $F_{IN}$ to $F_S/2$, all the even harmonics are folded on the zero frequency which is not taken into account on determination of signal SINAD. Further, similarly to what has been described previously, the even harmonics are folded on fundamental frequency $F_S/2$ and are thus filtered by filter 16.

The present invention has been described for a $\Sigma$-$\Delta$-type converter 14. However, the present invention may be applied to any type of converter which comprises a filtering stage performing a low-pass type filtering suppressing the noise outside of the useful band.

Of course, the present invention is likely to have various, alterations, improvements, and modifications which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A device for testing an analog-to-digital converter providing a digital signal at a given sampling frequency, comprising:
   a unit for providing a test signal to the converter, the test signal being a periodic signal comprising frequency components only at a fundamental frequency and at harmonics of the fundamental frequency, the fundamental frequency being a multiple of one quarter of the sampling frequency;
   a filter capable of receiving the digital signal and of rejecting the fundamental frequency to provide a filtered digital signal; and
   a unit capable of receiving the digital signal and the filtered digital signal and of providing a signal representative of the ratio between the effective powers of the digital signal and of the filtered digital signal.

2. The device of claim 1, wherein the unit for providing the test signal is capable of providing a signal only comprising frequency components at the fundamental frequency and at odd harmonics of the fundamental frequency.

3. The device of claim 1, wherein the unit for providing the test signal is capable of providing a square periodic signal.

4. The device of claim 1, wherein the unit for providing the test signal $S_{IN}$ is capable of providing a signal having its fundamental frequency equal to one quarter or to half of the sampling frequency.

5. The device of claim 1, wherein the converter comprises a filtering stage equivalent to a low-pass filter having its cut-off frequency equal to half of the sampling frequency.

6. The device of claim 1, wherein the converter is of sigma-delta type.

7. A method for testing an analog-to-digital converter providing a digital signal at a given sampling frequency, comprising the steps of:
   providing the converter with a test signal corresponding to a periodic signal comprising frequency components only at a fundamental frequency and at harmonics, the fundamental frequency being a multiple of one quarter of the sampling frequency;
   filtering the digital signal to reject the fundamental frequency; and
   determining the ratio between the effective powers of the digital signal and of the filtered digital signal.

8. The method of claim 7, wherein the test signal only comprises frequency components at the fundamental frequency and at odd harmonics of the fundamental frequency.

9. The method of claim 7, wherein the fundamental frequency is equal to one quarter or to half of the sampling frequency.

10. The method of claim 7, wherein the converter performs a low-pass type filtering of the digital signal at a cut-off frequency equal to half of the sampling frequency.

* * * * *